(12) United States Patent
Chiang et al.

(10) Patent No.: US 7,817,761 B2
(45) Date of Patent: Oct. 19, 2010

(54) TEST TECHNIQUES FOR A DELAY-LOCKED LOOP RECEIVER INTERFACE

(75) Inventors: Meei-Ling Chiang, Saratoga, CA (US);
Dwight K. Elvey, Sunnyvale, CA (US);
Sanjeev Maheshwari, San Jose, CA (US); Emerson S. Fang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 694 days.

(21) Appl. No.: 11/756,674

(22) Filed: Jun. 1, 2007

(65) Prior Publication Data
US 2008/0297216 A1    Dec. 4, 2008

(51) Int. Cl.
*H04L 7/00* (2006.01)
*H03L 7/06* (2006.01)
(52) U.S. Cl. ...................... 375/356; 327/158
(58) Field of Classification Search .......... 375/226, 375/356, 371, 376; 327/144, 153, 158, 161
See application file for complete search history.

(56) References Cited

U.S. PATENT DOCUMENTS

| | | | |
|---|---|---|---|
| 5,285,122 A * | 2/1994 | Honda et al. ............ | 327/277 |
| 5,465,065 A | 11/1995 | Stevens | |
| 5,652,530 A | 7/1997 | Ashuri | |
| 5,923,715 A * | 7/1999 | Ono ...................... | 375/376 |
| 6,337,590 B1 | 1/2002 | Millar | |
| 6,496,048 B1 | 12/2002 | Sikkink | |
| 6,633,190 B1 | 10/2003 | Alvandpour et al. | |
| 6,670,835 B2 | 12/2003 | Yoo | |
| 6,959,062 B1 | 10/2005 | Stubbs | |
| 7,109,767 B1 | 9/2006 | Amick et al. | |
| 7,126,429 B2 | 10/2006 | Mitric | |
| 7,271,634 B1 | 9/2007 | Daga et al. | |
| 2003/0002607 A1 | 1/2003 | Mooney et al. | |
| 2003/0152181 A1 * | 8/2003 | Stengel et al. ............ | 375/371 |
| 2003/0199262 A1 | 10/2003 | Chung | |

(Continued)

FOREIGN PATENT DOCUMENTS

EP    1601130    11/2005

OTHER PUBLICATIONS

Garlepp, Bruno W., et al., "A Portable Digital DLL for High-Speed CMOS Interface Circuits," IEEE Journal of Solid-State Circuits, vol. 34, No. 5, May 1999, pp. 632-644.

(Continued)

*Primary Examiner*—Khanh C Tran
(74) *Attorney, Agent, or Firm*—Zagorin O'Brien Graham LLP

(57) ABSTRACT

An integrated circuit includes a variable delay circuit configured to generate at least one delayed clock signal based on a first clock signal and a first control signal. The integrated circuit includes a control circuit configured to generate a count value based on a second input signal and a second control signal. The first clock signal is a first version of the at least one delayed clock signal. At least one of the second input signal and the second control signal is a second version of the at least one delayed clock signal and the count value is indicative of a frequency characteristic of the at least one delayed clock signal. The integrated circuit is configured to monotonically vary the first control signal over a range of values and the count value is determined for individual values of the control signal.

28 Claims, 7 Drawing Sheets

U.S. PATENT DOCUMENTS

| | | | |
|---|---|---|---|
| 2003/0226053 | A1 | 12/2003 | Khieu et al. |
| 2004/0046589 | A1 | 3/2004 | Gauthier et al. |
| 2004/0125905 | A1 | 7/2004 | Vlasenko et al. |
| 2004/0202266 | A1 | 10/2004 | Gregorius et al. |
| 2007/0230646 | A1 | 10/2007 | Talbot et al. |
| 2008/0056426 | A1* | 3/2008 | Si et al. .................. 375/373 |
| 2008/0295603 | A1* | 12/2008 | Shin et al. .................. 73/753 |

OTHER PUBLICATIONS

Maneatis, John G., "Low-Jitter Process-Independent DLL and PLL Based on Self-Biased Techniques," IEEE Journal of Solid-State Circuits, vol. 31, No. 11, Nov. 1996, pp. 1723-1732.

Sidiropoulos, Stafanos and Horowitz, Mark A., "A Semidigital Dual Delay-Locked Loop," IEEE Journal of Solid-State Circuits, vol. 32, No. 11, Nov. 1997, pp. 1683-1692.

Ng, Hiok-Tiaq, et al., "A Second-Order Semidigital Clock Recovery Circuit Based on Injection Locking," IEEE Journal of Solid-State Circuits, IEEE Service Center, Piscataway, NJ, US, vol. 38, No. 12, Dec. 2003, pp. 2101-2110.

Rambus "Phase Interpolator Based CDR," 6 pages, retrieved Apr. 13, 2006 from URL: http://www.rambus.com/products/innovationslicensing/innovations/interp_cdr.aspx.

* cited by examiner

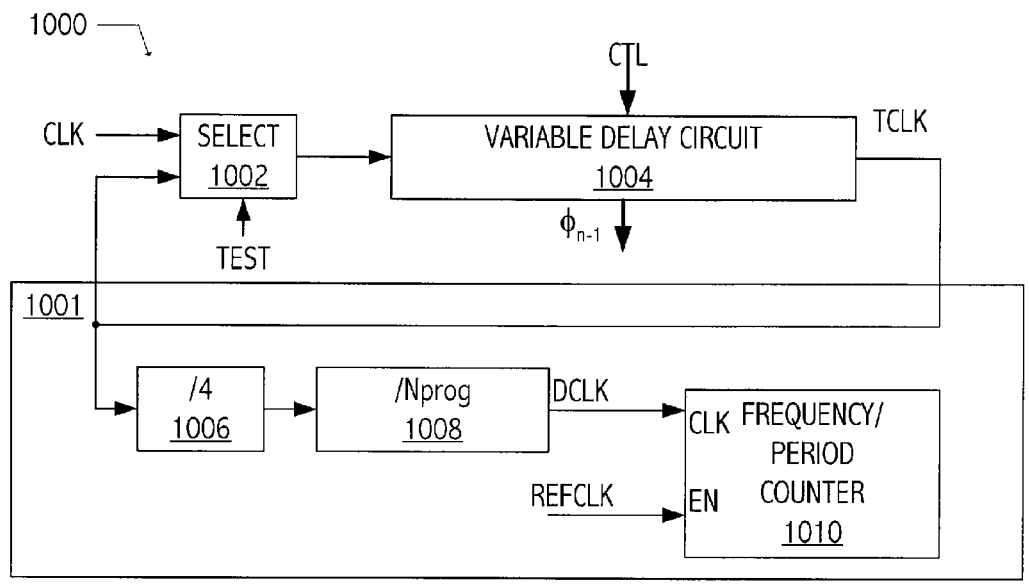
FIG. 8
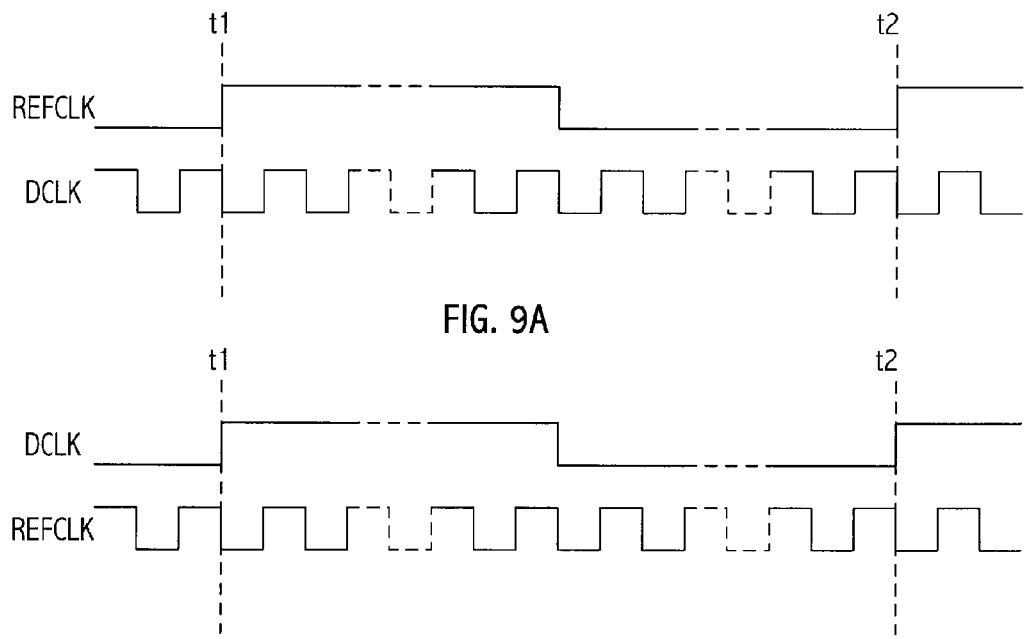
FIG. 9A
FIG. 9B

US 7,817,761 B2

TEST TECHNIQUES FOR A DELAY-LOCKED LOOP RECEIVER INTERFACE

BACKGROUND

1. Field of the Invention

This application is related to integrated circuits and more particularly to data communications links between integrated circuits.

2. Description of the Related Art

To properly recover data received by an integrated circuit node and transmitted across a data communications link by another integrated circuit node, the receiving node must sample the data during an appropriate phase of the data signal. A transmitting node compliant with an exemplary communications link may transmit, on a separate signal line, a reference clock signal for use in sampling commands, addresses or data (hereinafter, "data") by the receiving node. However, introduction of skew between a received data signal and a received sample clock signal (e.g., skew introduced by the channel of the communications link, the receiver, or other sources) may compromise data recovery. For example, if skew between the reference clock signal and the received data signal causes data transitions to approach the sampling point, the data transitions may fall within the clock signal setup time of a sampling device (e.g., flip-flop or other state element) causing errors in data recovery. In addition, the phase relationship between the received clock signal and the received data signal may not be stationary, which adds complexity to clock and data recovery operations.

SUMMARY

An integrated circuit receive interface circuit includes a variable delay circuit and a mechanism for characterizing the delay introduced by the variable delay circuit in response to a control signal. In at least one embodiment of the invention, an integrated circuit has at least a first mode of operation and a second mode of operation. The integrated circuit includes a variable delay circuit configured to generate at least one delayed clock signal based, at least in part, on a first clock signal and a first control signal. The integrated circuit includes a control circuit configured to generate a count value based, at least in part, on a second input signal and a second control signal. During the first mode of operation, the first clock signal is a first version of the at least one delayed clock signal. During the first mode of operation, at least one of the second input signal and the second control signal is a second version of the at least one delayed clock signal and the count value is indicative of a frequency characteristic of the at least one delayed clock signal. During the first mode of operation, the integrated circuit is configured to monotonically vary the first control signal over a range of values and the count value is determined for individual values of the control signal.

In at least one embodiment of the invention, a method for testing a variable delay circuit of an integrated circuit receiver interface includes monotonically varying a value of a control signal associated with the variable delay circuit. The variable delay circuit is configured as at least a portion of an oscillator circuit. The method includes counting a parameter and generating a plurality of parameter counts corresponding to individual values of the control signal. The parameter is associated with a frequency characteristic of an output signal of the variable delay circuit.

BRIEF DESCRIPTION OF THE DRAWINGS

The present invention may be better understood, and its numerous objects, features, and advantages made apparent to those skilled in the art by referencing the accompanying drawings.

FIG. 8 illustrates a block diagram of an exemplary test mode oscillator circuit consistent with one or more embodiments of the present invention.

FIGS. 9A and 9B illustrate exemplary timing diagrams consistent with the exemplary test mode oscillator circuit of FIG. 8.

The use of the same reference symbols in different drawings indicates similar or identical items.

DESCRIPTION OF THE PREFERRED EMBODIMENT(S)

Figure 1:
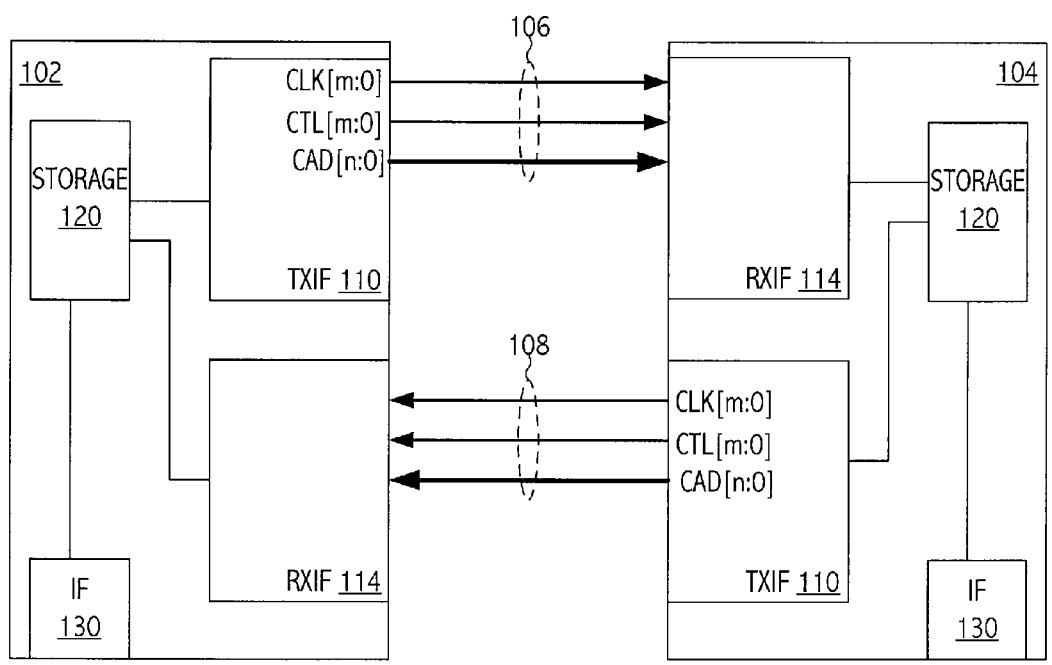
FIG. 1 illustrates a block diagram of two integrated circuit devices coupled by a communications link consistent with one or more embodiments of the present invention.

Referring to FIG. 1, integrated circuit 102 communicates with integrated circuit 104 by an exemplary communications link including transmit interfaces 110, receive interfaces 114, and communications paths 106 and 108, which include respective, individual communications paths for clock signals (e.g., CLK[m:0]), control signals (e.g., CTL[m:0]), and data signals (e.g., n-bits of commands, addresses, or data, i.e., CAD[n:0]). Those individual communications paths may be single-ended or differential communications paths. In at least one embodiment of the communications link, a bit-time is half of a clock period in duration, i.e., two data bits (e.g., two CAD[n:0] bits or two CTL[m:0] bits) are transmitted on a corresponding communications path per clock cycle (e.g., a period of a respective one of CLK[m:0]). However, the teachings herein may be adapted for bit-times having one clock period in duration (i.e., one data bit is transmitted on a corresponding communications path per clock cycle) or for other suitable bit-time durations. Communications paths 106 and 108 are unidirectional, i.e., communications paths 106 provide paths from integrated circuit 102 to integrated circuit 104 and communications paths 108 provide paths to integrated circuit 102 from integrated circuit 104. Integrated circuit 102 may include a sideband control mechanism (e.g., interface 130) that provides access to control and/or status registers internal to integrated circuit 102 (e.g., locations in storage circuit 120). Interface 130 may be a Joint Test Action Group (i.e., JTAG) interface, System Management Bus (i.e., SMBus) interface, or other suitable interface. In at least one embodiment, interface 130 communicates test, characterization, and/or diagnostic information between the corresponding integrated circuit and an external processing device (not shown).

Figure 2:
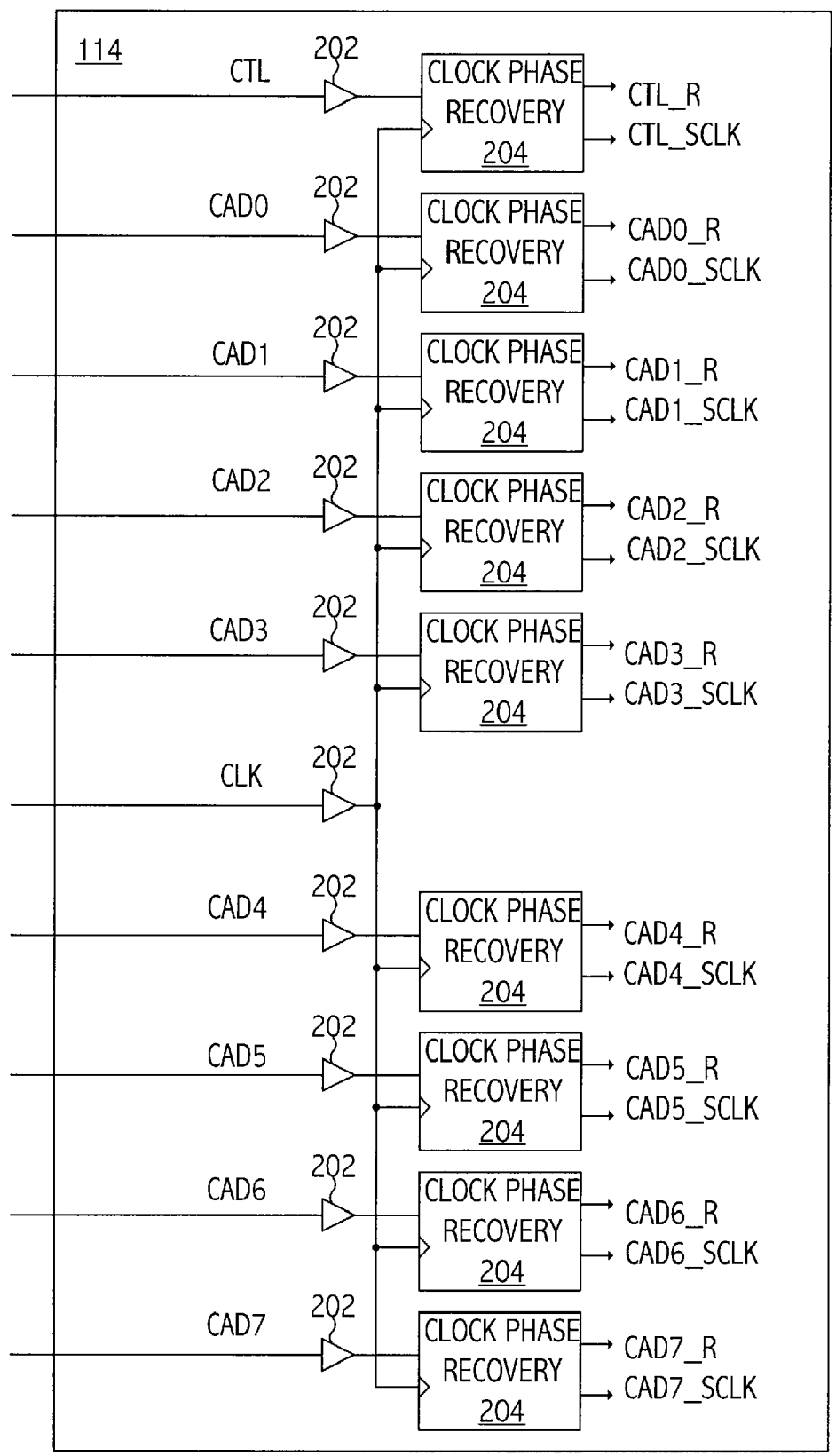
FIG. 2 illustrates a block diagram of a portion of a communications link receive path on an integrated circuit device consistent with one or more embodiments of the present invention.

Referring to FIG. 2, exemplary signals on individual communications paths, CLK, CTL, and CAD[7:0] are received by individual receivers 202 and individual clock phase recovery circuits 204 in receive interface 114 of integrated circuit 104. During data communications operations, receivers 202 may perform signal equalization, signal level shifting, noise reduction, or other appropriate signal processing functions. Exemplary clock phase recovery circuits 204 individually receive a received clock signal (e.g., CLK) in addition to a respective, received data signal (e.g., CTL, CAD0, CAD1, . . . , CAD7). Clock phase recovery circuits 204 generate corresponding sample clocks (e.g., CTL_SCLK, CAD0_SCLK, CAD1_SCLK, . . . , CAD7_SCLK) and provide the recovered data (e.g., CTL_R, CAD1_R, CAD2_R, . . . CAD7_R) to other circuitry of receive interface 114. An individual sample clock signal (e.g., CAD4_SCLK) is a dynamically delayed version of the received clock signal (e.g., CLK), which is dynamically delayed based at least in part on a phase difference between the received clock signal and the corresponding received data signal (e.g., CAD4).

In at least one embodiment of receive interface 114, individual ones of clock phase recovery circuits 204 generate a sample clock signal for sampling the received data signal at the center of a data eye of the received data signal. The phase difference between the received clock signal and the received data signal may be non-stationary, i.e., this phase difference varies during a period of communications link operation. Thus, the delay applied to the received clock signal to generate the sample clock signal is adjusted during the period of communications link operation, accordingly. In at least one embodiment of clock phase recovery circuits 204, the phase difference between the received clock signal and the received data signal at the receiver is less than a particular transport phase difference threshold value (e.g., 3 unit intervals or bit-times). However, in other embodiments of clock phase recovery circuits 204, the phase difference between the sample clock signal and the received data signal may be greater than that particular transport phase difference threshold value.

Figure 3:
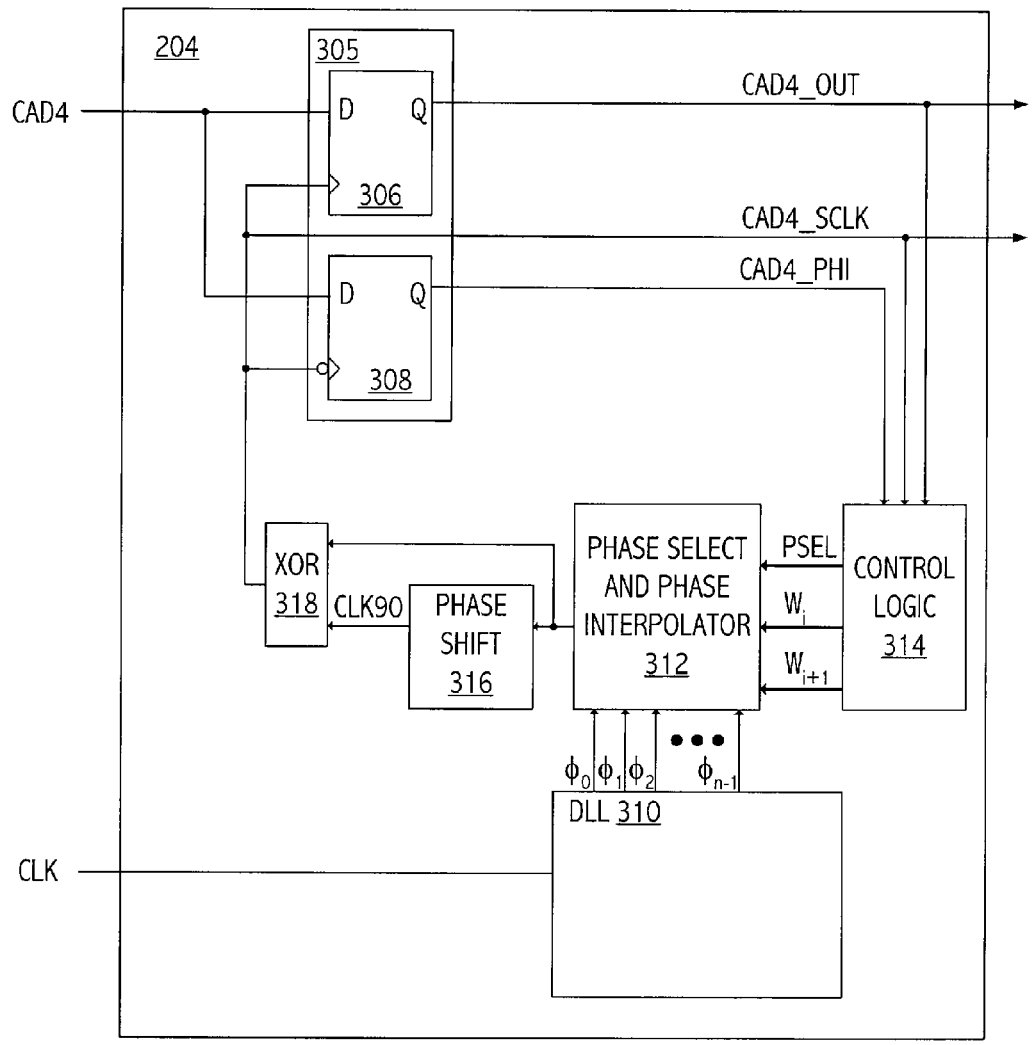
FIG. 3 illustrates a block diagram of an exemplary clock phase recovery circuit consistent with one or more embodiments of the present invention.

Referring to FIG. 3, an exemplary clock phase recovery circuit (e.g., clock phase recovery circuit 204) recovers phase information from the received data signal (e.g., CAD4) and the received clock signal (e.g., CLK) to generate a sample clock signal (e.g., CAD4_SCLK) and a sampled data signal (CAD4_OUT). In at least one embodiment, phase detector 305 includes two flip-flops (e.g., flip-flop 306 and flip-flop 308) that sample the received data signal based on the sample clock signal (e.g., CAD4_SCLK) 180° out of phase with each other. Phase detector 305 provides two signals, a sampled received data signal and a signal providing phase information, e.g., CAD4_OUT and CAD4_PHI, respectively. Those signals are indicative of the phase difference between the received data signal and the received clock signal and are provided to control logic circuit 314.

Figure 6:
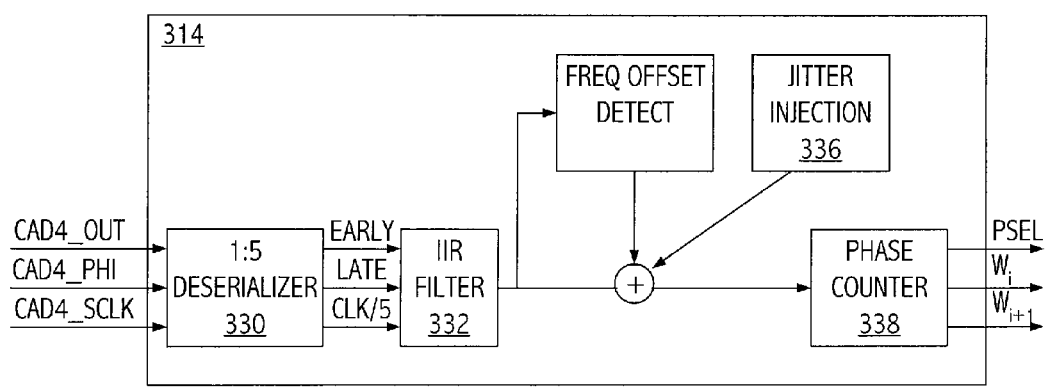
FIG. 6 illustrates a block diagram of an exemplary control logic circuit of a clock phase recovery circuit of FIG. 3 consistent with one or more embodiments of the present invention.

During data communications operations, control logic circuit 314 generates digital control signals (e.g., PSEL, $W_i$, and $W_{i+1}$) for adjusting the sample clock signal based, at least in part, on a comparison of CAD4_OUT to CAD4_PHI. Control logic circuit 314 controls a phase selection and phase interpolation circuit, (e.g., phase select and phase interpolation circuit 312) to generate the sample clock signal having a target phase relationship to the received data signal. For example, control logic circuit 314 may generate control signals PSEL, $W_i$, and $W_{i+1}$ to apply an appropriate delay to the received clock signal to generate the sample clock signal to sample the received data signal in substantially the center of the data eye. Referring to FIG. 6, in an exemplary control logic circuit 314, deserializer circuit 330 determines whether the phase of the sample clock signal is early or late with respect to the received data signal and generates a corresponding phase change request (e.g., phase counter 338 provides appropriate values of PSEL, $W_i$, and $W_{i+1}$) based on this determination. The phase change request applies a delay to shift the phase of the sample clock signal in a direction that aligns the sample clock signal with an appropriate phase of the data signal. Note that the relationship between phase ($\phi$, in degrees) and delay ($t_D$, in seconds) is $\phi=360\times t_D \times f$ (where frequency, f, is measured in Hz). In at least one embodiment of control logic circuit 314, digital circuitry included in control logic circuit 314 is responsive to a clock derived from the sample clock signal (e.g., CLK/k, a frequency divided version of CLK generated by deserializer circuit 330). However, other clock signals of suitable frequency may be used by control logic circuit 314.

Figure 4:
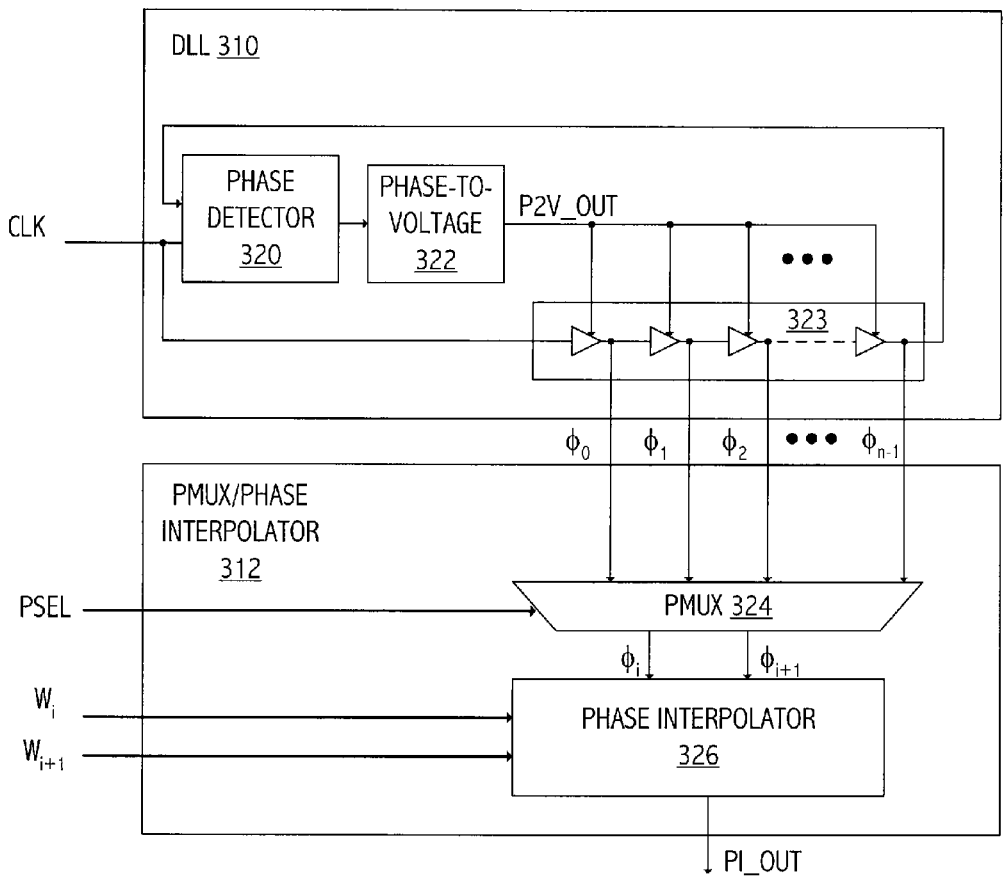
FIG. 4 illustrates a block diagram of an exemplary portion of the clock phase recovery circuit of FIG. 3 consistent with one or more embodiments of the present invention.

Referring back to FIG. 3, in addition to receiving control signals from control logic circuit 314, phase select and phase interpolation circuit 312 receives n phase signals from delay-locked loop (DLL) 310 (e.g., $\phi_0, \phi_1, \ldots, \phi_{n-1}$) which generates these signals based on the received clock signal. Referring to FIG. 4, in at least one embodiment of clock phase recovery circuit 204, DLL 310 includes a delay line (e.g., delay line 323) that is configured to have a total delay equal to the period of the received clock signal. Phase signals $\phi_0, \phi_1, \ldots, \phi_{n-1}$ are spaced evenly to cover the 360° phase space of the received clock signal. Phase signals $\phi_0, \phi_1, \ldots, \phi_{n-1}$ are versions of the received clock signal delayed by equivalent increments from next adjacent phase signals. Those phase signals may be generated by tapping off appropriate nodes of the delay line. In an exemplary DLL 310, DLL 310 locks at the 180° point of the received clock signal, which is a half-rate clock signal (e.g., approximately 2.6 GHz at an approximately 5.2 Gbps data rate) to provide a total delay that is equal to one unit interval or bit-time (e.g., approximately 192 ps for an approximately 2.6 GHz received clock signal). In at least one embodiment, of DLL 310, phase signals $\phi_0, \phi_1, \ldots, \phi_{n-1}$ include n/2 true phase signals (e.g., $\phi_0, \phi_1, \ldots, \phi_{n/2-1}$) and corresponding n/2 complementary phase signals (e.g., $\phi_{0B}, \phi_{1B}, \ldots, \phi_{(n/2-1)B}$) in implementations of clock phase recovery circuit 204 that include complementary delay lines in DLL 310, as discussed below.

Delay-locked loop 310 includes a feedback loop including phase detector 320, which may be any suitable phase detector that compares the received clock signal to a delayed version of the received clock signal to generate a phase difference signal. That phase difference is applied to delay line 323 in a way that achieves a cumulative delay of delay line 323 that is equal to a period of the received clock signal or a predetermined portion of a period of the received clock signal. For example, delay line 323 may be a voltage-controlled delay line. The phase difference output of phase detector 320 may be converted by phase-to-voltage circuit 322 into a voltage (e.g., P2V_OUT) that is applied to delay line 323 to adjust the delay of individual delay elements of the delay line to be equivalent and to have a duration that provides a cumulative delay of the delay line equal to the period of the received clock signal. In at least one embodiment, phase-to-voltage converter circuit 322 includes a digital-to-analog converter circuit and a low pass filter circuit, which may include a charge pump. In at least one embodiment of phase detector 320, a binary phase detector or bang-bang type phase detector is used, providing a digital output signal of '1' or '0,' indicating a respective one of an early or late relationship between the received clock signal and the delayed version of the received clock signal. Phase-to-voltage circuit 322 receives the digital output signal and integrates the signal using, e.g., a digital counter that increments in response to an early indication and decrements in response to a late indication. The counter output may be converted into a voltage by a digital-to-analog converter circuit and provided to a smoothing filter to generate an output voltage signal indicating the phase difference. In at least one embodiment of DLL 310, delay line 323 is a current-controlled delay line and the phase difference is converted by an appropriate circuit, accordingly.

In an exemplary embodiment of clock phase recovery circuit 204, DLL 310 includes two complementary delay lines driven by complementary versions of the received clock signal. The two complementary delay lines are tapped after each inverter of the delay lines to provide phase-adjacent signals separated by only one inverter delay, thereby improving phase resolution by a factor of two of the individual delay lines. In such an exemplary DLL 310, DLL 310 locks at the 180° point of the received clock signal, which is a half-rate clock signal (e.g., approximately 2.6 GHz at a 5.2 Gbps data rate) to provide a delay of the individual ones of the complementary delay lines that is equal to one unit interval or bit-time (e.g., approximately 192.3 ps for a 2.6 GHz received clock signal). Delay-locked loop 310 outputs true taps from delay line 323 (e.g., $\phi_0, \phi_1, \ldots, \phi_5$), which provide the first 180° of phase signals. In addition, DLL 310 outputs complement taps (e.g., $\phi_{0B}, \phi_{1B}, \ldots, \phi_{5B}$), which provide the second 180° of phase signals. Those twelve phase signals cover the 360° of phase with 30° of separation between adjacent phases, each phase signal providing an exemplary delay of (30°/360°)×(1/2.6 GHz)=32.05 ps.

Figure 7:
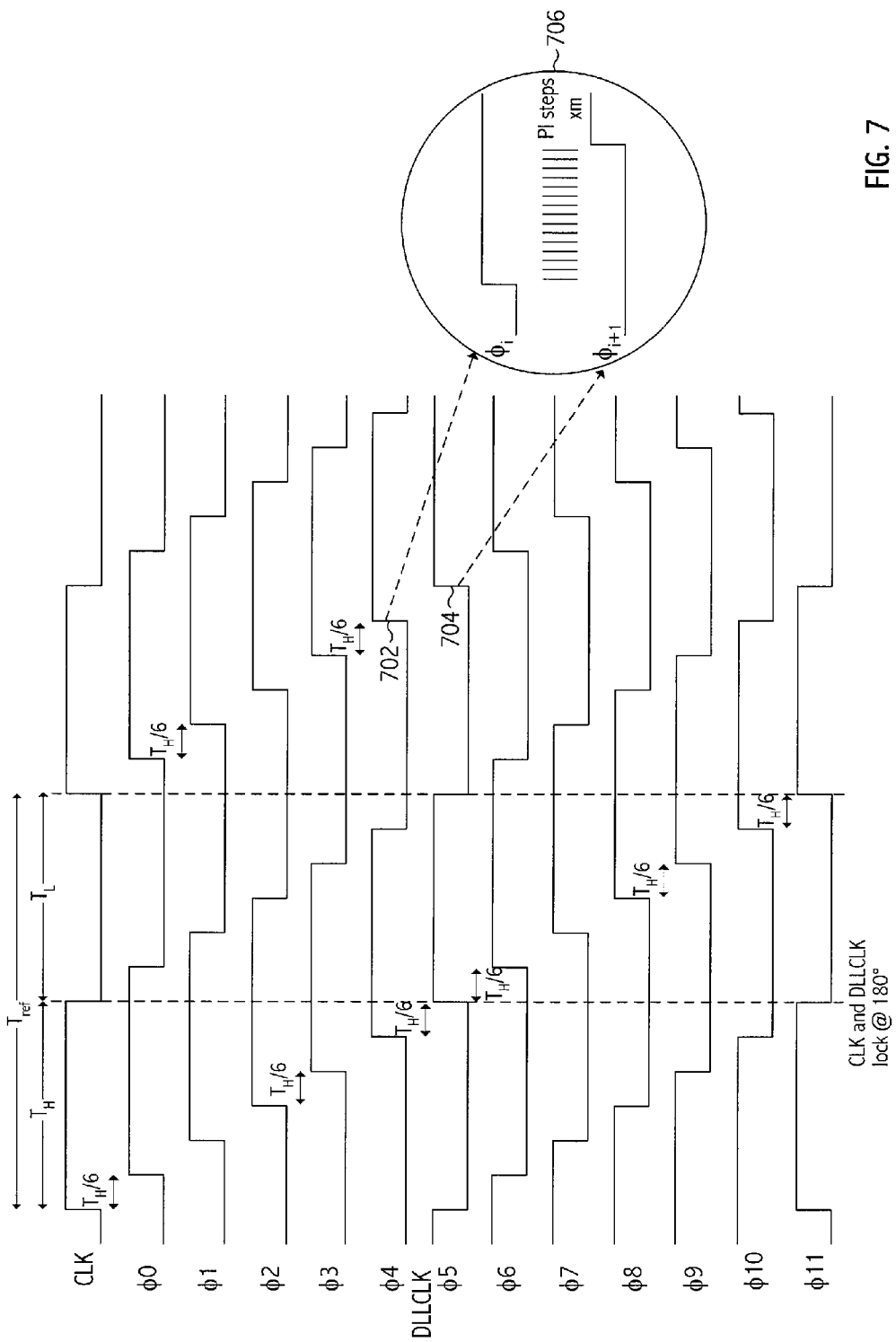
FIG. 7 illustrates a timing diagram of exemplary waveforms consistent with the portion of the clock phase recovery circuit of FIG. 4.

Referring to FIGS. 4 and 7, since DLL 310 outputs only discrete values and the phase difference between the received clock signal and the received data signal may not be exactly one of these discrete values, phase select and phase interpolation circuit 312 selects (e.g., according to PSEL) two adjacent phase signals that have phases with respect to the received clock signal that are nearest to the phase difference to be applied to the received clock signal for use in generating the sample clock signal. Those two adjacent phase signals (e.g., $\phi_i$ and $\phi_{i+1}$) are received by phase interpolation circuit 326, which may perform a phase interpolation of the two adjacent phase signals to generate an interpolated clock signal (e.g., PI_OUT) that is used to generate the sample clock signal. Phase interpolation circuit 326 may be any suitable phase interpolation circuit. Phase interpolator designs are well known in the art and are typically dependent upon the particular DLL implementation and electrical parameters of the interface in which they operate.

The phase difference between the received clock signal and the received data signal may not fall exactly between the selected adjacent phase signals and phase interpolator 326 may not apply an equal weight to each of the adjacent phase signals. Rather, phase interpolator 326 may receive control signals (e.g., weighting signals $W_i$ and $W_{i+1}$) generated by control logic circuit 314 that indicate an appropriate weighting function for application to phase signals $\phi_i$ and $\phi_{i+1}$ to generate the signal having an intermediate phase, e.g., PI_OUT. Accordingly, PI_OUT is an interpolated version of $\phi_i$ and $\phi_{i+1}$ having a particular phase relationship with the received data signal and is used to generate the sample clock signal, which may be phase aligned with the center of the data eye of the received data signal.

In at least one embodiment, DLL 310 provides only exemplary discrete values 0°, 30°, 60°, 90°, 120°, ..., 330° phase shift signals. In at least one embodiment of phase interpolation circuit 326, weighting signals $W_i$ and $\phi_{i+1}$ are four bits wide, i.e., each of the phase signals $\phi_i$ and $\phi_{i+1}$ may be weighted by one of sixteen different values, to obtain a signal having one of sixteen different phases in between the phases of $\phi_i$ and $\phi_{i+1}$, as illustrated in detail 706 of FIG. 7 by m (e.g., m=16) equally spaced phase steps between transition 702 of signal $\phi_4$ and transition 704 of $\phi_5$. For example, to obtain a phase shift of approximately 157.5°, which is between the discrete phase shifts of 150° and 180°, control logic circuit 314 provides a value for $W_i$ that weights $\phi_4$ by 4/16 and a value for $W_{i+1}$ that weights $\phi_5$ by 12/16 (e.g., (150°×12/16)+(180°×4/16)=157.52°).

Referring back to FIG. 4, phase select and phase interpolation circuit 312 includes phase select circuit 324. Exemplary phase select circuits are described in U.S. patent application Ser. No. 11/742,860, filed May 1, 2007, entitled "Phase Select Circuit with Reduced Hysteresis Effect," which application is hereby incorporated by reference. However, any suitable phase select circuit may be used.

Figure 5:
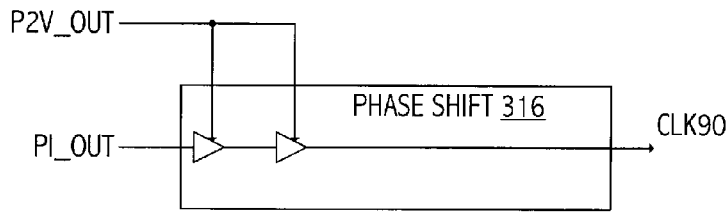
FIG. 5 illustrates a block diagram of an exemplary phase shifting circuit of a clock phase recovery circuit of FIG. 3 consistent with one or more embodiments of the present invention.

Referring back to FIG. 3, the sample clock may be generated by an exclusive- or (e.g., as applied by XOR 318) of the intermediate phase signal (e.g., PI_OUT) with a phase-shifted version of the intermediate phase signal. For example, the intermediate phase signal is a phase-shifted version of the received clock signal and, thus, is a half-rate clock signal (e.g., approximately 2.6 GHz at a 5.2 Gbps data rate). A full-rate clock signal (e.g., approximately 5.2 GHz at a 5.2 Gbps data rate) is generated by exclusive-oring the intermediate phase signal with a version of the intermediate phase signal that is phase shifted by 90°. Referring to FIG. 5, an appropriate phase shift (e.g., a 90° phase shift) is generated by including within exemplary phase shift circuit 316, an appropriate fraction of the number of delay elements in the delay line 323 of DLL 310. The delay elements in phase shift circuit 316 are adjusted by the voltage generated by phase-to-voltage circuit 322 (e.g., P2V_OUT) that is applied to delay line 323 to adjust the delay of individual delay elements of delay line 323 to be equivalent and to have a duration that provides a total delay of the delay line equal to an appropriate period of the received clock signal. In at least one embodiment of the invention, P2V_OUT is applied to phase shift circuit 316 to provide a 90° phase shift. Referring back to FIG. 3, the signal generated by XOR 318 is the sample clock signal that is used to sample the received data signal. One edge of the sample clock signal (i.e., a rising or a falling edge) is aligned with transitions in the received data signal. The other edge of the sample clock signal is half of a unit interval away from the data edge, which is generally in the center of the data eye and is used to sample the received data signal. Note that since transmit clock jitter is present in both the received data signal and the received clock signal, the transmit clock jitter is effectively a common mode phase variation that is rejected by clock phase recovery circuit 204.

At least a portion of the circuits included in receive interface 114 are analog circuits that are not testable via typical design for test techniques (e.g., scan chain techniques). For example, DLL 310 and/or phase select and phase interpolation circuit 312 include circuitry that is not entirely testable by typical scan techniques. In at least one receive interface 114, system specifications are satisfied if a frequency characteristic of an output of a variable delay circuit has a linear response to a corresponding control signal, i.e., the delay generated by the variable delay circuit is directly proportional to the value of the control signal and the delay varies continuously with changes in the value of the control signal. As referred to herein, a frequency characteristic of a signal is the period or the frequency of the signal.

Although probe techniques or other analog measurement techniques may be used to characterize DLL 310 and phase select and phase interpolation circuit 312, those techniques may be time consuming and/or expensive. Accordingly, in at least one embodiment of receive interface 114, digital control circuitry is configured to characterize the response of variable delay circuits of the receive interface as a function of corresponding digital control signals. For example, the linearity of variable delay line 323, phase select and phase interpolation circuit 312, and/or other delay circuits of receive interface 114, as a function of respective control signals may be determined during a test mode (e.g., as indicated by control signal TEST) of receive interface 114.

Referring to FIG. 8, a variable delay circuit (e.g., variable delay circuit 1004) is configured as part of an oscillating circuit. For example, during a test mode, the output of variable delay circuit 1004 (e.g., REFCLK) is coupled to an input node of test mode oscillator circuit 1000 and the input of variable delay circuit 1004 is based thereon, e.g., via select circuit 1002. Oscillation is guaranteed by introducing positive feedback in test mode oscillator circuit 1000. For example, in at least one embodiment of test mode oscillator circuit 1000, variable delay circuit 1004 is a differential circuit having a differential output node (e.g., TCLK includes TCLKP and TCLKN). To ensure oscillation of the differential output signal TCLKP and TCLKN, an inversion is introduced between the output of variable delay circuit 1004 and select circuit 1002 by coupling TCLKP and TCLKN to nodes of opposite polarity at the input of select circuit 1002. For a single-ended embodiment of variable delay circuit 1004, an inverter circuit (e.g., within select circuit 1002) results in an odd number of inversions in test mode oscillator circuit 1000. In addition, no oscillation, multi-mode oscillation, and multi-edge oscillation configurations may be reduced or eliminated by properly initializing variable delay circuit 1004. For example, while powering up test mode oscillator circuit 1000, select circuit 1002 is configured to select the CLK signal and CLK is held at logic '0' or logic '1.' Then, the test mode oscillator circuit is configured to oscillate by closing the loop, e.g., select circuit 1002 introduces a positive feedback signal based on TCLK. Accordingly, variable delay circuit 1004 forms a portion of test mode oscillator circuit 1000 and the output of the variable delay line (e.g., TCLK) is an oscillating signal.

In at least one embodiment, variable delay circuit 1004 may include circuitry that is used for functionality of receive interface 114 during an operational mode (e.g., a data communications mode). However, in at least another embodiment, variable delay circuit 1004 may only be operational during a test mode and includes circuits that are substantially the same as circuits used during an operational mode. In the latter embodiment, select circuit 1002 may not be included.

A linearity characteristic of the oscillating signal may be determined by measuring the delay introduced by the variable delay circuits to the REFCLK signal in response to monotonic changes in the corresponding control signal CTL. An exemplary linearity test includes varying a value of a control signal associated with variable delay circuit 1004 (e.g., CTL) from a lowest allowable value to a highest allowable value. Note that the delay introduced by elements outside the variable delay circuit is substantially fixed and is substantially small as compared to the delay through the variable delay circuit. During the exemplary linearity test, a frequency characteristic of REFCLK is expected to change substantially linearly in response to the changes in CTL, i.e., the frequency characteristic is expected to be proportional to corresponding changes in CTL. For example, a frequency of oscillation decreases with control signal levels that increase the delay of the variable delay circuit and a period of the oscillating signal increases with control signal levels that increase the delay of the variable delay circuit. Note that in at least one embodiment of test mode oscillator circuit 1000, a digital value of CTL is converted into an analog control signal and the linearity test indicates the linearity of response of the variable delay circuit 1004 and the conversion circuitry (not shown). The conversion circuitry may include any suitable filtering circuits and/or digital-to-analog conversion circuits.

Frequency/period counter circuit 1010 of test mode oscillator circuit 1000 can be configured as a frequency counter or a period counter to characterize the linearity of the variable delay circuit 1004. Referring to FIG. 9A, in a frequency counting mode (as configured in FIG. 8) a reference timer signal (e.g., REFCLK) is used to control frequency/period counter circuit 1010. Divider circuits 1006 and 1008 are configured to frequency divide TCLK to a frequency consistent with a selected bit-width of the frequency/period counter 1010, e.g., to reduce or eliminate counter overflow. Thus, a counter bit-width and/or selectable frequency divider value may be used to adjust a resolution of the count value. A first edge of a reference timer signal (e.g., rising edge of REFCLK at t1 of FIG. 9A) is used to clear the count value of frequency/period counter circuit 1010. Frequency/period counter circuit 1010 increments based on a first edge (e.g., a rising edge) of the input signal DCLK, while holding the value of CTL constant. A next edge of the reference timer signal (e.g., a next rising edge of REFCLK at t2 of FIG. 9A) may freeze the counter value. Then, this value may be written to memory or provided off-chip (e.g., via an interface 130 of integrated circuit 102 or 104 of FIG. 1, or other suitable interface) for analysis. The value of CTL may then be changed to a next value, the counter value cleared again, and a new count value generated, frozen, and provided for analysis.

Referring back to FIGS. 9 and 10, in a period counting mode, a first edge of the divided down oscillator output (e.g., DCLK at t1 of FIG. 9B) is used to clear the count value of frequency/period counter circuit 1010. Frequency/period counter circuit 1010 is controlled by a frequency divided version of TCLK (e.g., DCLK). Divider circuits 1006 and 1008 are configured to divide down TCLK to have an appropriate period for counting a number of REFCLK periods (e.g., based on resolution requirements and/or counter range). Thus, a counter bit-width and/or selectable frequency divider value may be used to adjust a resolution of the count value. Frequency/period counter circuit 1010 increments based on a first edge (e.g., a rising edge) of the reference timer signal REFCLK, while holding the value of CTL constant. A next edge of the divided down oscillator output (e.g., a next rising edge of DCLK at t2) freezes the counter value. The resulting counter value indicates a number of periods of REFCLK that are in one period of DCLK. This value may then be written to memory or provided off-chip (e.g., via an interface 130 of integrated circuit 102 or 104 of FIG. 1, or other suitable interface) for analysis. The value of CTL may then be changed to a next value, the counter value cleared again, and a new count value generated, frozen, and provided for analysis.

In at least one embodiment of receive interface 114, a control logic timer and a counter used in typical data communications operations (i.e., a non-test mode) may be configured as frequency/period counter circuit 1010 in the test mode. However, in at least one or more embodiments of test mode oscillator circuit 1000, one or more of divider circuits 1006 and 1008 and frequency/period counter circuit 1010 may be included on the integrated circuit for test purposes only.

A number of bits required in the timer and counter of frequency/period counter circuit 1010 depends on a required resolution (e.g., number of counts per least-significant bit), the delay of the variable delay line, and the delay of the elements in test mode oscillator circuit 1000 outside the variable delay line (e.g., select circuit 1002). The amount of test time required is based on the number of allowable values of control signal CTL and a period of the signal used to clear and freeze frequency/period counter circuit 1010. To reduce the impact of a long test time, the testing may be performed during a burn-in procedure.

Figure 10:
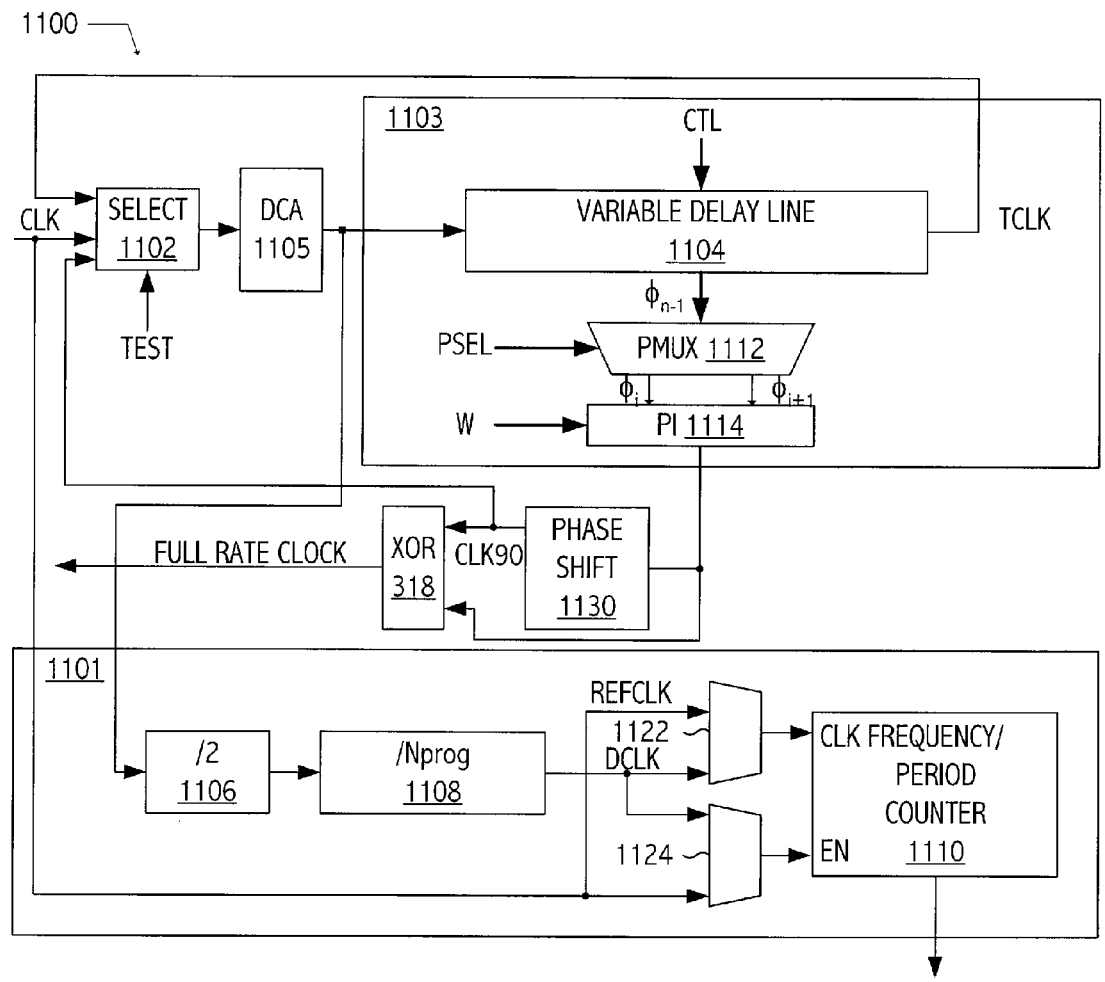
FIG. 10 illustrates a block diagram of an exemplary test mode oscillator circuit consistent with one or more embodiments of the present invention.

Variable delay circuit 1004 may include a variable delay line, a phase select circuit, a phase interpolation circuit, or other suitable circuitry to be characterized by including those circuits in the loop formed by test mode oscillator circuit 1000. Referring to FIG. 10, in at least one embodiment of receive interface 114, the variable delay circuit may be selectively configured to include variable delay line 1104 or to include circuits in addition to a variable delay line. Duty cycle adjust circuit 1105 is described in U.S. patent application Ser. No. 11/742,845, filed May 1, 2007, entitled "Parallel Multiplexing Duty Cycle Adjustment Circuit with Programmable Range Control," which application is hereby incorporated by reference. An exemplary variable delay circuit 1103 includes variable delay line 1104, phase select circuit 1112, and phase interpolation circuit 1114. Select circuit 1102 may select between a feedback loop based on the output of variable delay line 1104 or a feedback loop including variable delay line 1104, phase select circuit 1112, phase interpolation circuit 1114, and phase shift circuit 1130. Accordingly, the linearity of phase select circuit 1112 and phase interpolation circuit 1114 may be characterized using frequency/period counter circuit 1110, which operates similar to the frequency/period counter circuit 1010, described above with reference to FIG. 8.

By increasing control signals PSEL and/or $W_i$ and $W_{i+1}$ to vary across the index of phase signals $\phi_0$ to $\phi_{n-1}$ and/or phase weights, the delay of variable delay line 1104, phase select circuit 1112, and phase interpolation circuit 1114 is expected to increase linearly. Accordingly, frequency/period counter circuit 1110 may be configured as a period counter to easily characterize the linearity of the relationship between the counter output and the input control signals PSEL and/or $W_i$ and $W_{i+1}$. Select circuits 1122 and 1124 configure frequency/period counter circuit 1110 as one of a frequency counter circuit or a period counter circuit, which in some embodiments is based on whether select circuit 1102 selects REF-CLK or CLK90, respectively, to form test mode oscillator circuit 1100. Accordingly, only one counter circuit may be included in test mode oscillator circuit 1100 to perform a linearity test generating a count proportional to a frequency of oscillation and a linearity test generating a count proportional to a period of the oscillating signal.

Referring back to FIG. 2, after collecting data for an associated receive interface 114 (e.g., during a burn-in procedure), an integrated circuit may be rejected as not meeting specifications if analysis of the data indicates that any one of the clock phase recovery circuits 204 of an associated receive interface 114 does not have a linear response to a control signal of an associated variable delay circuit. Thus, portions of integrated circuits that are not otherwise testable using scan techniques may be easily tested during a production test mode.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which the received data signals have bit-times of half the received clock period in duration, one of skill in the art will appreciate that the teachings herein can be utilized with received data signals having other bit-times and receiver interfaces operating consistent with other clock and data recovery techniques. Note that variable delay circuits other than a variable delay line, phase select circuit or phase interpolation circuits may also be characterized using techniques described herein. Variations and modifications of the embodiments disclosed herein, may be made based on the description set forth herein, without departing from the scope and spirit of the invention as set forth in the following claims.

What is claimed is:

1. An integrated circuit having at least a first mode of operation and a second mode of operation, the integrated circuit comprising:
   a variable delay circuit configured to generate at least one delayed clock signal based, at least in part, on a first clock signal and a first control signal; and
   a control circuit configured to generate a count value based, at least in part, on a second input signal and a second control signal;
   wherein during the first mode of operation, the first clock signal is a first version of the at least one delayed clock signal,
   wherein during the first mode of operation, at least one of the second input signal and the second control signal is a second version of the at least one delayed clock signal and the count value is indicative of the frequency characteristic of the at least one delayed clock signal,
   wherein during the first mode of operation, the integrated circuit is configured to monotonically vary the first control signal over a range of values and the count value is determined for individual values of the control signal.

2. The integrated circuit, as recited in claim 1, wherein, while the mode indicator indicates a second mode, the first control signal configures at least a portion of the variable delay circuit to have a total delay equal to at least a portion of the period of a received clock signal received by the integrated circuit.

3. The integrated circuit, as recited in claim 1, wherein the control circuit is selectively configurable to count at least one of a number of edges of the second version of the at least one delayed clock signal based on the second control signal and a number of edges of the second control signal based on a period of the second version of the at least one delayed clock signal.

4. The integrated circuit, as recited in claim 1, wherein the resolution of the count value is selectable.

5. The integrated circuit, as recited in claim 1, wherein the variable delay circuit is configured to generate a plurality of delayed versions of the first clock signal, individual delayed signal versions of the plurality of delayed versions of the first clock signal being delayed by equivalent amounts from respective next adjacent individual delayed signal versions.

6. The integrated circuit, as recited in claim 5, wherein the variable delay circuit comprises a plurality of delay elements coupled in series, individual delay elements of the plurality of delay elements being controllable to have substantially equal delays.

7. The integrated circuit, as recited in claim 6, wherein the variable delay circuit further comprises:
   a select circuit configured to provide to first and second nodes, respective ones of a first signal and a second signal of the plurality of delayed versions of the first clock signal, the first and second signals being adjacent ones of the plurality of delayed versions of the first clock signal; and
   an interpolation circuit configured to provide an interpolated signal based, at least in part, on the first signal and the second signal,
   wherein the interpolated signal is the at least one delayed clock signal.

8. The integrated circuit, as recited in claim 1, wherein the first mode is a test mode.

9. The integrated circuit, as recited in claim 1, wherein the second version of the output signal has a lower frequency than the first version of the output signal.

10. The integrated circuit, as recited in claim 1, wherein the control circuit comprises:
    at least one divider circuit, configured to generate the second version of the output signal based, at least in part on the output signal.

11. The integrated circuit, as recited in claim 10, wherein the at least one divider circuit comprises a programmable divider circuit.

12. The integrated circuit, as recited in claim 11, wherein the at least one divider circuit further comprises a fixed divider circuit coupled to the programmable divider circuit.

13. The integrated circuit, as recited in claim 1, further comprising:
    a select circuit configured to provide one of at least the output signal and a received clock signal to the variable delay circuit, based, at least in part, on a selected one of the at least first and second modes.

14. A method for testing an integrated circuit receiver interface comprising:
    monotonically varying a value of a control signal associated with the variable delay circuit, the variable delay circuit being configured as at least a portion of an oscillator circuit; and
    counting a parameter and generating a plurality of parameter counts corresponding to individual values of the control signal, the parameter being associated with a frequency characteristic of a signal based on an output signal of the variable delay circuit.

15. The method, as recited in claim 14, wherein the parameter is a number of edges of the signal in at least a portion of a period of a clock signal.

16. The method, as recited in claim 14, wherein the parameter is a number of periods of a clock signal in at least a portion of a period of the signal.

17. The method, as recited in claim 14, further comprising:
    selecting the output of the variable delay circuit as the input of the variable delay circuit according to an indication of a mode of the integrated circuit, thereby configuring the variable delay circuit as the at least a portion of the oscillator circuit.

18. The method, as recited in claim 14, further comprising:
    selecting a precision of a counter circuit based, at least in part, on the parameter.

19. The method, as recited in claim 14, further comprising:
    configuring a counter circuit to measure a selected one of the frequency characteristics of the signal and the period of the signal.

20. The method, as recited in claim 14, further comprising:
    providing, by the variable delay circuit, a plurality of delayed versions of an input clock signal, individual delayed signal versions of the plurality of delayed versions of the first clock signal being delayed by equivalent amounts from respective next adjacent individual delayed signal versions.

21. The method, as recited in claim 14, further comprising:
    selecting from the plurality of delayed versions of the input clock signal, a first clock signal having a first phase and a second clock signal having a second phase, the first and second clock signals being adjacent ones of the plurality of delayed versions of the first clock signal; and
    generating an interpolated clock signal based on the first and second clock signals in response to the control signal.

22. The method, as recited in claim 21, wherein the signal based on the output signal of the variable delay circuit is a version of the interpolated clock signal.

23. The method, as recited in claim 14, wherein the signal based on the output signal of the variable delay circuit is the output signal of the variable delay circuit.

24. An apparatus comprising:
    a variable delay means of an integrated circuit receiver interface, the variable delay means being responsive to a control signal; and
    means for characterizing linearity of delay associated with the integrated circuit receiver interface in response to the control signal,
    wherein the means for characterizing monotonically varies the control signal over a range of values and generates a plurality of parameter counts corresponding to individual values of the control signal, the parameter counts being associated with frequency characteristics of signals based on at least one output of the variable delay circuit corresponding to individual values of the control signal.

25. The apparatus, as recited in claim 24, wherein the means for characterizing linearity comprises means for adjusting precision of the means for determining linearity.

26. An apparatus comprising:
    a variable delay means of an integrated circuit receiver interface, the variable delay means being responsive to a control signal; and means for characterizing linearity of delay associated with a signal based on at least one output of the variable delay means in response to the control signal, wherein the variable delay means further comprises:

means for generating a plurality of delayed versions of a clock signal, individual delayed signal versions of the plurality of delayed versions of the clock signal being delayed by equivalent amounts from respective next adjacent individual delayed signal versions in response to at least the control signal.

27. The apparatus, as recited in claim 26, wherein the variable delay means further comprises:

means for generating an interpolated clock signal based on at least one of the plurality of delayed versions of the clock signal indicated by the control signal.

28. The apparatus, as recited in claim 26, wherein the signal based on at least one output of the variable delay means is a phase interpolated signal based on the plurality of delayed versions of the clock signal.

* * * * *